June 6, 1961 L. M. GERMAIN 2,987,629

VOLTAGE COMPARATOR

Filed July 10, 1957 3 Sheets-Sheet 1

INVENTOR.
LLOYD M. GERMAIN
BY
Eli Weiss
ATTORNEY

INVENTOR.
LLOYD M. GERMAIN
BY
Eli Weiss
ATTORNEY

June 6, 1961 L. M. GERMAIN 2,987,629
VOLTAGE COMPARATOR
Filed July 10, 1957 3 Sheets-Sheet 3

INVENTOR.
LLOYD M. GERMAIN
BY
Eli Weiss
ATTORNEY

United States Patent Office 2,987,629

Patented June 6, 1961

2,987,629

VOLTAGE COMPARATOR

Lloyd M. Germain, New York, N.Y., assignor to Burroughs Corporation, Detroit, Mich., a corporation of Michigan Filed July 10, 1957, Ser. No. 670,964

12 Claims. (Cl. 307—88.5)

This invention relates generally to a potential discriminator and more particularly to a maximum-minimum potential indicator.

Briefly, operation of a transistor depends upon the generation and control of a flow of electric charge carriers within a semiconductor. At present semiconductors can be of germanium or silicon of the N-type or P-type. The N-type of semiconductor has a predominance of negative carriers (electrons), and the P-type of semiconductor has a predominance of positive carriers (holes). If an N-type of germanium crystal is brought together in intimate contact with a P-type of germanium crystal to form a junction, the resulting P-N junction will exhibit the unilateral property of having an easy path for an electric current flow in one direction only.

A germanium crystal having P-type and N-type regions can be arranged within an appropriate circuit to amplify the power of an electric signal. For example, the N-P-N junction transistor consists of a germanium crystal of two N-type regions separated by a thin layer of a P-type region. Large area metal contacts attached to each of the three regions provide means to connect the transistor to circuit elements. The contacts to the N, P, and N layers are referred to respectively as the emitter terminal, the base terminal, and the collector terminal. Another type of transistor that is in common use is the P-N-P junction transistor which consists of a germanium crystal of two P-type regions separated by a thin layer of an N-type region.

When appropriate potentials are applied to the emitter and collector terminals of a semiconductor, the application of a small A.C. input signal across the base terminal and emitter terminal will result in a relatively large output signal at the collector terminal.

Generally, the occurrence or absence of a specific condition can be indicated by the presence or absence of a potential. If the maximum or minimum potential of a plurality of potentials is determinable, and its source identifiable, then a plurality of cooperating channels could be observed simultaneously for the occurrence of a specific condition by having each identifiable condition generate an extreme potential in a particular channel. For example, in the sequential identification of a plurality of randomly positioned items such as letters of the alphabet, a separate terminal can be provided for each letter or character. Each character of the alphabet contains portions or segments that are common, in whole or in part, with portions of other characters of the alphabet, however, each character has at least one portion that makes it distinctive from all other characters. When a particular character is scanned, each terminal will receive a pattern of signals or absence of signals that are fed to separate step chargers which display potentials proportional to the number of signals received. However, by proper design of the sensing circuit, the terminal that represents the character scanned will exhibit an extreme potential (minimum or maximum) relative to the potentials exhibited by all of the other terminals.

In the sequential identification of a plurality of items such as letters of the alphabet, difficulty has arisen in sampling simultaneously a plurality of potentials to detect and identify a predetermined extreme potential to indicate the item scanned.

It is an object of this invention to provide a device that can identify from a plurality of terminals that terminal that exhibits a maximum potential.

It is another object of this invention to provide a device that can identify from a plurality of terminals that terminal that exhibits a minimum potential.

It is an additional object of this invention to provide a device that can check a plurality of terminals simultaneously for a maximum potential.

It is also an object of this invention to provide a device that can check a plurality of terminals simultaneously for a minimum potential.

It is another object of this invention to provide a device that can store several different inputs for comparison in the same circuit.

It is still another object of this invention to provide a device that can detect accurately small differentials of potentials to identify a terminal that exhibits a maximum or a minimum potential.

It is still another object of this invention to provide a device that is economical to produce and reliable in operation.

Other objects and many of the attendant advantages of this invention will be readily appreciated as the apparatus becomes better understood by reference to the following detailed description when considered in connection with the accompanying drawings wherein.

Figures 3, 4:
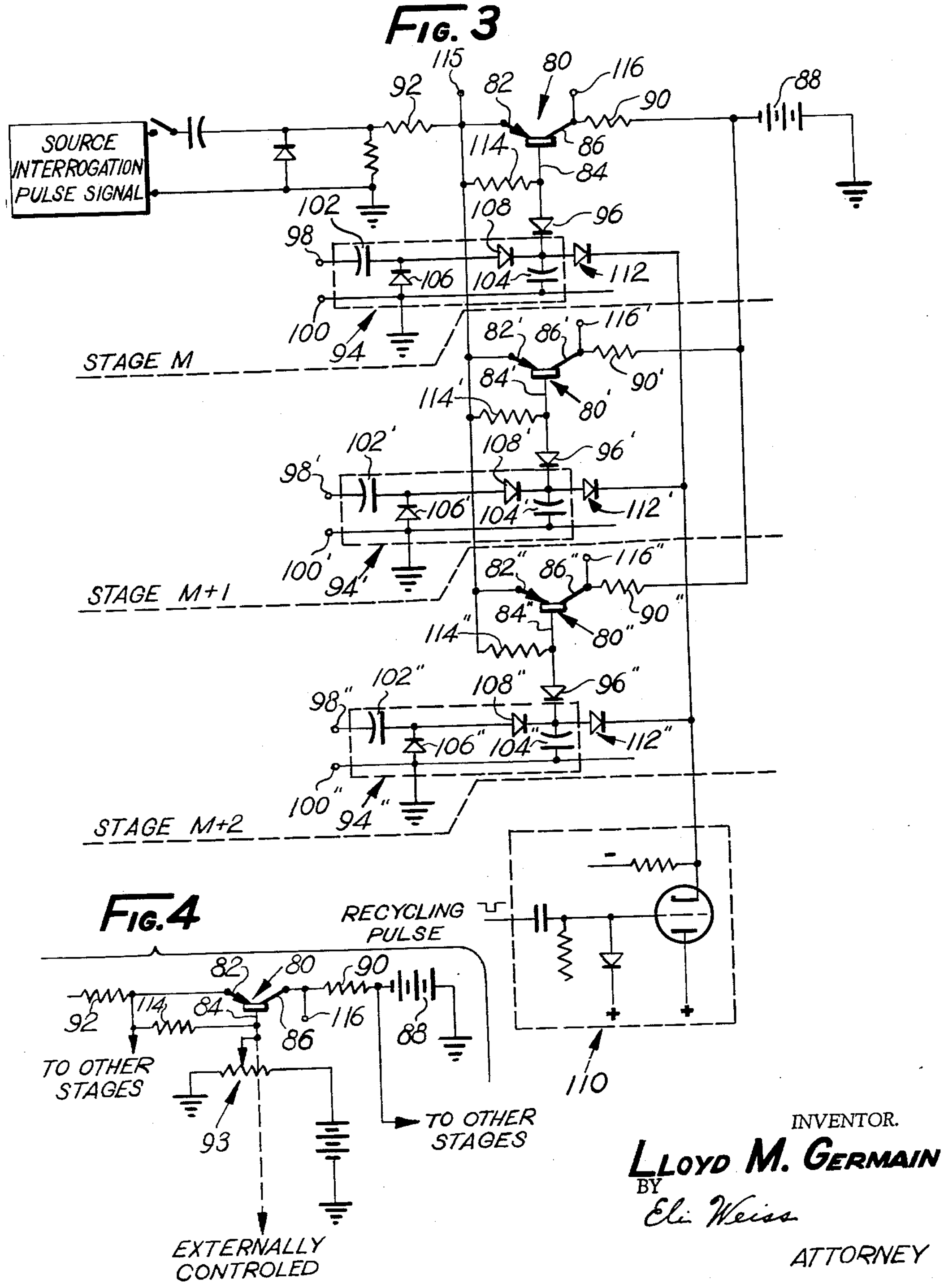

FIG. 3 schematically illustrates a circuit in accordance with this invention that can store a number of potentials and check each of the potentials simultaneously to locate and identify the maximum or minimum of a plurality of potentials;

FIG. 4 illustrates schematically another form of this invention; and

Figure 5:
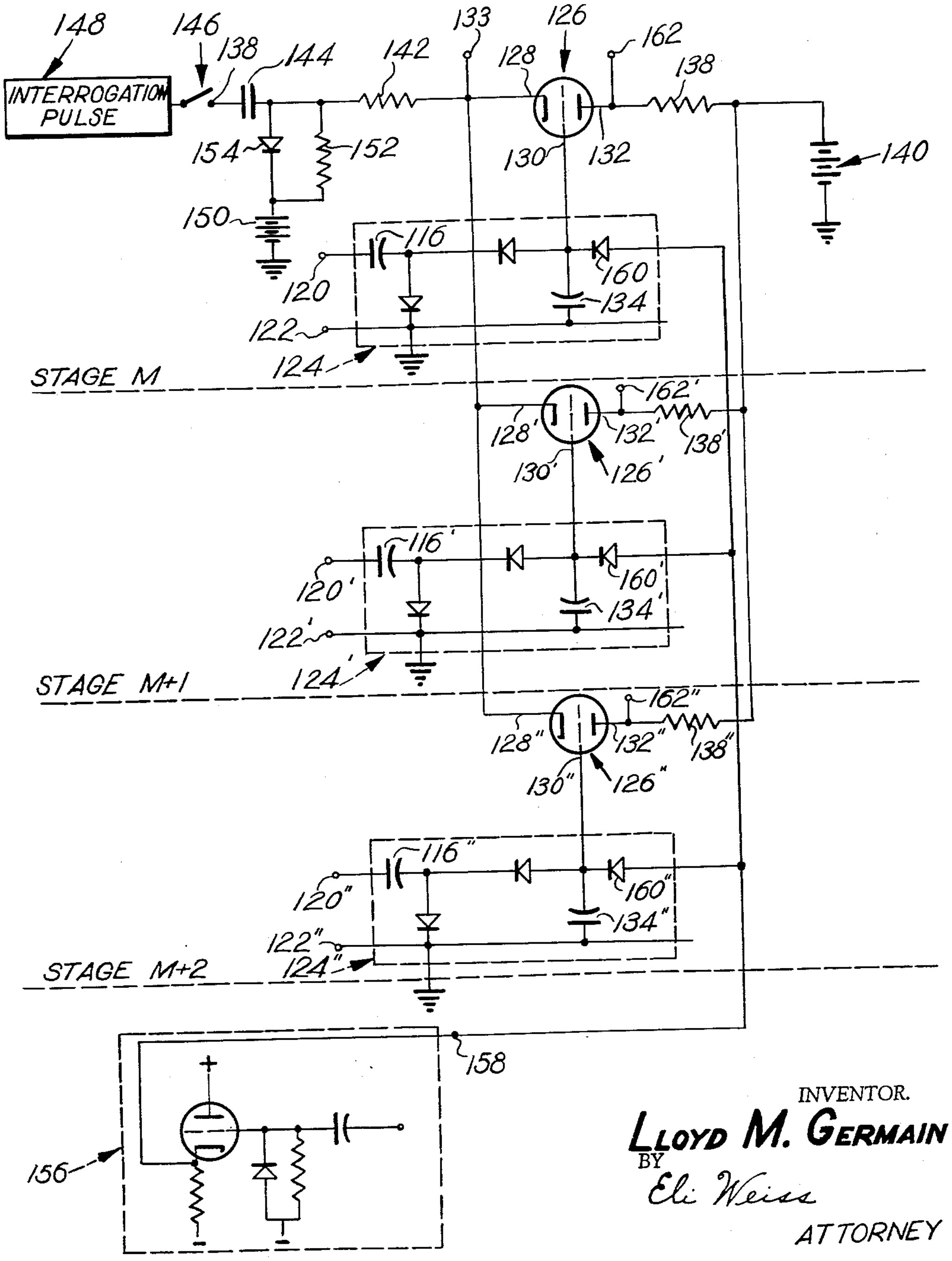

FIG. 5 illustrates schematically another embodiment of this invention for locating and identifying a least negative potential from a plurality of potentials.

Briefly, to locate and ascertain the magnitude of the maximum or minimum potential displayed by one of a plurality of potential sources where each source exhibits a potential having a different magnitude, each source of potential is coupled to a separate signal translating device or transducer, such as a transistor or vacuum tube. A source of supply potential is coupled to each transducer through a separate load impedance, and a source of interrogation potential signals is coupled to feed a signal through a common impedance to each of the transducers. Depending upon the circuit utilized, a pulse from the source of interrogation potential fed to each of the transducers will indicate and locate an extreme potential displayed by the plurality of potential sources.

In this scanner not only can the magnitude of the desired potential be determined, but its source can also be identified. If a capacitor is utilized as a source of potential, then by feeding the signals from each incoming line to a separate capacitor, the device can be utilized as a step counter to indicate that line that receives either a minimum or a maximum number of pulse signals.

Figure 1:
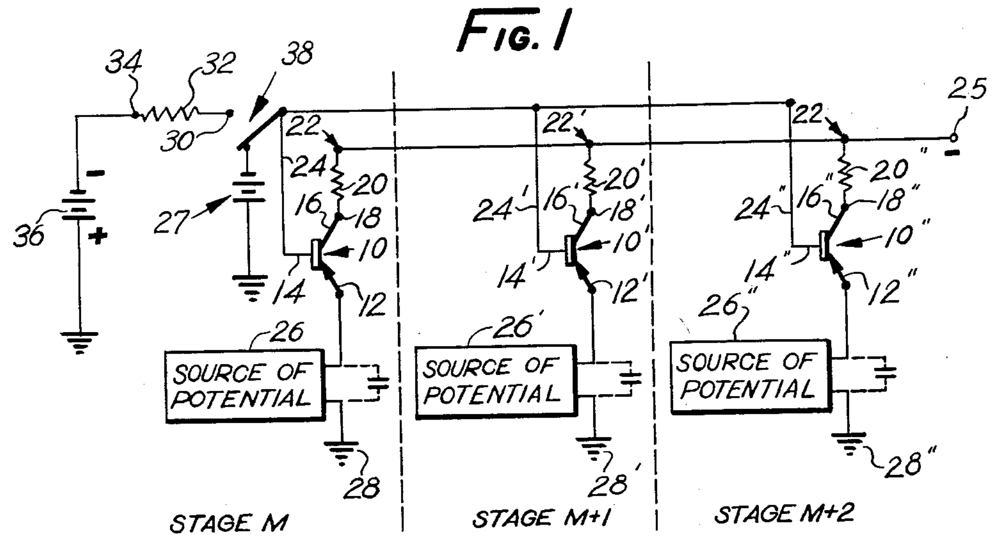
FIG. 1 illustrates a circuit in accordance with this invention that identifies the maximum potential of a plurality of potentials.
Figure 2:
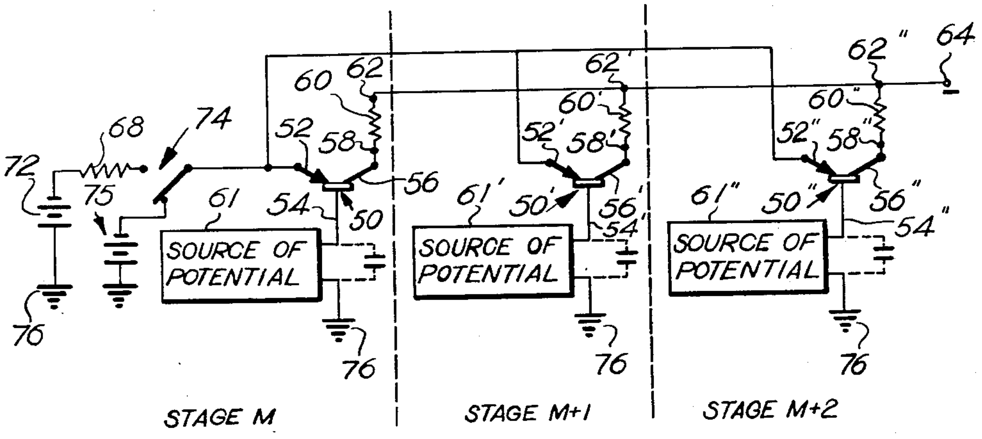
FIG. 2 illustrates a circuit in accordance with this invention that identifies the minimum potential of a plurality of potentials.

In each FIG. 1, 2, 3 and 5 the first stage has been labeled stage M, the second stage has been labeled stage $(M+1)$, and the third stage has been labeled stage $(M+2)$. Since the three stages M, $M+1$, and $M+2$ are identical, only the first stage of each figure will be described in detail, however, corresponding components of the second and third stages of each figure will be designated respectively by prime and double prime reference numerals. It should be understood, however, that these embodiments are not limited to the three stages illustrated and that additional stages can be added or subtracted to compare an increased or decreased number of potentials simultaneously. In FIGS. 1, 2, and 3 there is illustrated three stages each of which includes a transistor for indicating a predetermined extreme potential displayed by any one of a plurality of sources of potentials at some predetermined instant.

Referring to FIG. 1 there is illustrated an extreme potential indicating network having three stages M, $M+1$, and $M+2$ for indicating the magnitude of the maximum potential displayed by any one of a plurality of sources of potentials at some predetermined instant. A circuit for indicating which of various potential sources has an extreme potential will be described below with reference to FIG. 3. In stage M, a switching means such as a semiconductor device or transistor 10 of the P-N-P type supports an emitter terminal 12, a base terminal 14, and a collector terminal 16. The collector terminal 16 is coupled to one end 18 of a load impedance 20. The other end 22 of each load impedance 20 of each stage is coupled to an output terminal 25 which in turn is coupled to a source of negative supply potential. The positive terminal of a source of potential 26 is coupled to the emitter terminal 12, and the negative terminal of the source 26 is coupled to a ground terminal 28. The base terminals 14, 14', 14'' of each of the stages M, $M+1$, and $M+2$ is coupled to the arm of a switch 38. The normally closed contact of the switch can be coupled to a ground terminal either directly or through a battery supply 27 to define a limit of operation of the transistors or a reference level for the detection of the maximum potential. The normally open contact 30 of the switch 38 is connected through a common resistor 32 to the negative potential terminal of a source of interrogation signals 36. The positive potential terminal of the source 36 is coupled to a ground terminal.

The circuit disclosed in FIG. 1 can indicate, at any particular instant, the magnitude of the maximum or largest potential displayed by the sources of potential 26, 26', or 26''.

In operation, the arm of the switch 38 is placed in the down position; and each source of potential 26, 25', and 26'' of each stage M, $M+1$, and $M+2$ is varied by separate external control means such that only one source of potential will display a maximum potential relative to the other sources of potential. To obtain the magnitude of the maximum potential displayed by the various sources of potentials, the arm of switch 38 is moved to the up position to pass an interrogation pulse signal from the source 36 through the common resistor 32 to each of the base terminals 14, 14', and 14'', simultaneously. The transistor whose emitter is most positive will be the first to conduct. The voltage differential between the base terminal and the emitter terminal of the conducting transistor will be very small. However, since the base terminals of each of the transistors 10, 10', and 10'' of the three stages M, $M+1$, and $M+2$ are coupled together, the first transistor that conducts will feed a positive potential signal to the base terminal of each of the other transistors, and all the transistors whose emitter terminals are coupled to a source of potential that displays a potential smaller than the most positive potential displayed will be cut off.

It should be noted, however, that if charged capacitors are substituted for the sources of fixed potentials 26, 26', and 26'', then the source of interrogation pulse signals must be removed from the base terminals of the transistor of each stage before the capacitor that displays the maximum potential discharges to the next higher potential exhibited by another capacitor, or a second output potential will appear at the output terminal 25.

Referring to FIG. 2, there is illustrated an extreme potential indicating network having three stages M, $M+1$, and $M+2$ for indicating the magnitude of the minimum potential displayed by a plurality of sources of potentials at some predetermined instant.

In stage M, a switching means such as a semiconductor device or transistor 50 of the P-N-P type supports an emitter terminal 52, a base terminal 54, and a collector terminal 56. The collector terminal 56 is coupled to one end terminal 58 of a load resistor 60. The other end terminal 62, 62', and 62'' of each load resistor 60, 60', and 60'' of each stage is coupled to a common output terminal 64 which, in turn, is coupled to a source of negative supply potential. The emitter terminal 52, 52', and 52'' of each stage is coupled to the arm of a switch 74. The normally closed contact of the switch can be coupled to a ground terminal either directly or through a battery supply 75 to define a limit of operation of the transistors or a reference level for the detection of the minimum potential. The normally open contact of the switch 74 is connected through a common resistor 68 to the negative potential terminal of a source of interrogation pulse signals 72. The positive potential terminal of the source 72 is coupled to a ground terminal 76. A positive potential terminal of a source of potential 61 is coupled to the base terminal 54 of the transistor 50; and the negative potential terminal of the source 61 is coupled to the ground terminal 76.

The circuit disclosed in FIG. 2 can indicate, at any particular instant, the magnitude of the minimum or smallest potential displayed by any one of a plurality of sources of potential 61, 61', or 61'' relative to the other sources of potentials.

The operation of the circuit illustrated in FIG. 2 is similar to the operation explained previously for the circuit illustrated in FIG. 1, except that the magnitude of the minimum potential is indicated, not the maximum potential.

A careful study of the circuits disclosed in FIGS. 1 and 2 will reveal that the circuit of FIG. 1 will present a low impedance to the potentials that are to be compared while the circuit of FIG. 2 will present a high impedance to the potentials that are to be compared. Therefore, if a choice exists as to whether the P-N-P or N-P-N type of transistor should be used, the configuration that will allow the sources of unknown potentials to be coupled to the base terminals of the transistors should be utilized as this will result in the least disturbance to the unknown potentials.

Referring to FIG. 3, there is illustrated in detail an extreme potential indicating network or a maximum-minimum count selection circuit built around the circuit illustrated in FIG. 2. The extreme potential identified is determined by the type of transistor utilized.

In stage M, a semiconductor or transistor 80 of the P–N–P type supports an emitter terminal 82, a base terminal 84, and a collector terminal 86. The collector terminal 86 is coupled to the negative terminal of a source of transistor supply voltage 88 through a load resistor 90, and the emitter terminal 82 is coupled to a source of interrogation pulse signals through a resistor 92. The resistor 92 is common to the emitter terminal of each of the transistors of the stages M, $M+1$, and $M+2$. However, each collector 86, 86', and 86'', is coupled to the source of supply potential 88 through a separate resistor 90, 90', and 90'' respectively. The base terminal 84 of the transistor 80 is coupled to a pulse signal divider network 94 through a crystal diode rectifier 96. A source of pulse signals is coupled to feed a signal to the input terminals 98 and 100 of the pulse signal divider network 94. The network 94 divides the input signal into two proportionate parts to appear across the two series coupled capacitors 102 and 104. The input terminal 100 is connected to a ground terminal. A crystal diode 108 positioned in series between said capacitors 102 and 104 inhibits the potential fed to the capacitor 104 from leaking off. A second crystal diode 106 coupled between the output side of the capacitor 102 and the ground terminal provides a discharge path for the capacitor 102. Immediately after a pulse signal is fed to the input terminals 98 and 100 of the network 94, the capacitor 102 will be discharged and the capacitor 104 will exhibit a proportionate part of the magnitude of the input signal. Each pulse signal that is fed to the input terminals 98 and 100 increases the potential that is present across the capacitor by a small determinable amount until saturation is reached. The capacitor 104 is large in value to prevent saturation, and operation is in the linear portion of its curve. Thus, the potential present across the capacitor 104 is determined by the number of pulse signals fed to the input terminals of the network 94.

The common point between the crystal diode 96 and the capacitor 104 is coupled to a discharge network 110 through a crystal diode 112. The crystal diodes 96, 108, and 112 of stage M prevent the charge on the capacitor 104 from leaking off. A resistor 114 couples the emitter terminal 82 to the base terminal 84 to maintain the transistor at the cut off state. In this manner spurious outputs are eliminated when many channels are utilized by preventing the flow of small leakage currents. Output terminals 116, 116', and 116'', of the three stages are coupled to their respective transistor collector terminals 86, 86', and 86''.

In operation, incoming pulses fed to the input terminals of the stages M, $M+1$, and $M+2$ will produce a determinable potential across each of the capacitors 104, 104', and 104'' respectively. The charge on each capacitor is thus storable and is dependent upon the number of pulse signals fed to the input terminals of the pulse signal divider network 94. The crystal diodes 96, 108, and 112 in stage M and in each of the corresponding stages can be of the silicon type which exhibit high back resistances to prevent the charge on the capacitor from leaking off.

At some instant when the source and magnitude of the minimum potential is to be determined, a pulse from the source of interrogation pulse signals is fed through the common resistor 92 to emitter terminals 82, 82', and 82'' of the transistors 80, 80', and 80'' respectively. The transistor coupled to the capacitor 104, 104', or 104'' that exhibits the minimum potential relative to all of the other potentials exhibited will conduct first and an output pulse signal will appear across its load resistor. The other transistors will be clamped in a nonconducting state through their emitter terminals. Thus, only the transistor that is coupled to the capacitor that exhibits the minimum potential will conduct, all the other transistors will be cut off. The output terminal 116, 116', or 116'' that is associated with the capacitor that exhibits the minimum potentials will indicate the channel that supports that minimum potential.

The actual value of the minimum potential appears on an output terminal 115 that is connected to the emitter terminals 82, 82', and 82''.

After the magnitude and the location of the minimum potential has been determined the capacitors 104, 104', and 104'' can be discharged simultaneously by activating the discharge network 110 in preparation for receipt of the next set of input signals.

In some instances it may be preferable to identify an extreme potential exhibited by a potentiometer or a conductor that can be subjected to a small leakage current without ill effects. In this instance, referring to FIG. 4, a potentiometer 93 or conductor can be substituted for the pulse signal divider network 94, the diodes 96 and 112, and resistor 114 of FIG. 3 without affecting the operation of the device. It should be noted that since there are no capacitors present, a discharge network is not necessary.

Referring to FIG. 5, there is illustrated in detail a minimum count selection circuit built around vacuum tubes. Each stage M, $M+1$, and $M+2$ is coupled to receive negative potential pulse input signals from a distinct externally controlled source. In stage M, the negative input signals are fed to the input terminals 120 and 122 of a pulse signal divider network 124. The network 124 is similar in design and operation to the network 94 of FIG. 3 with the exception that network 124 can store and count negative pulse signals instead of positive pulse signals. A switching means such as a vacuum tube 126 supports a cathode 128, a grid 130, and a plate 132. The grid 130 is connected to the capacitor 134 of the network 124. It should be noted that a crystal diode is not required between the grid 130 and the capacitor 134 as the grid current is extremely small. The plate 132 of stage M is coupled through a load resistor 138 to a source of plate supply voltage 140. Each stage has a separate load resistor interposed between the vacuum tube and the source of plate voltage.

The cathodes 128, 128', and 128'' of each stage M, $M+1$, and $M+2$ are connected through a common resistor 142, a capacitor 144, and an on-off switch 146 to a source of interrogation pulse signals 148. The junction of the resistor 142 and the capacitor 144 is coupled to a source of positive potential 150 through a resistor 152 connected in parallel with a crystal diode 154.

Each capacitor 134, 134', and 134'' is coupled, respectively through a crystal diode 160, 160', and 160'' to an output terminal 158 of a discharge network 156. A positive potential pulse signal from the discharge network will discharge each of the capacitors 134, 134', and 134'' simultaneously. An output terminal 162, 162', and 162'' is coupled to the anode 132, 132', and 132'' respectively in each stage to indicate that stage that exhibits a minimum potential. A second output terminal 133 is coupled to the cathode of each tube to indicate the magnitude of the minimum potential.

In operation, the capacitors 134, 134', and 134'' are first discharged simultaneously by a pulse signal from the discharge network. Negative pulse signals fed to the input terminals of each stage will produce a determinable potential across the capacitor 134, 134', and 134'' of each stage. The potential present across each capacitor will be dependent, however, upon the number of pulse signals fed to the input terminals of that stage.

The cathode of the vacuum tube of each stage is maintained at a positive potential by the source 150 to condition each of the vacuum tubes to a cut-off state.

At some instant when the magnitude of the minimum potential and the stage that exhibits the minimum potential relative to the other potentials exhibited is to be identified, the on-off switch 146 is closed and a signal from the source of interrogation pulse signals is fed through the coupling capacitor 144, and through the common resistor 142 to the cathode of each vacuum tube of each stage M, M+1, and M+2. This pulse signal drives the cathode of each vacuum tube simultaneously to a negative potential from the positive cut-off potential generated by the source 150. As the cathodes of each vacuum tube simultaneously go more and more negative, that vacuum tube that is associated with the capacitor that exhibits the minimum negative potential will be the first to conduct. For purposes of explanation only, it shall be assumed that the capacitor 134 exhibits the minimum potential and therefore the vacuum tube 126 is the first to conduct. As soon as tube 116 starts to conduct, its cathode 128 and therefore all the other cathodes 128' and 128'' are clamped at a potential slightly higher than the potential present on the grid 130. Since the cathodes 128' and 128'' cannot go more negative, the vacuum tubes 126' and 126'' remain in the cut-off state. The output terminal 162 is the only terminal that exhibits a change of potential to locate the capacitor 124 that exhibits the minimum potential.

After the location and magnitude of the minimum potential has been determined, the discharge network 156 is activated and each of the capacitors 134, 134′, and 134″ is discharged simultaneously in preparation for the arrival of the next set of input signals.

Obviously many modifications and variations of the present invention are possible in the light of the above teachings. It is therefore to be understood that within the scope of the appended claims the invention may be pracitced otherwise than as specifically descirbed.

What is claimed is:

1. A maximum-minimum potential indicator for identifying an extreme potential from a plurality of different potentials comprising a first semiconductor, a first capacitor that displays a potential coupled to said first semiconductor, a second semiconductor, a second capacitor that displays a different potential coupled to said second semiconductor, an impedance, a source of interrogation signals coupled to feed a signal through said impedance to said first and second semiconductors simultaneously to pass an extreme potential from one of said plurality of capacitors through its associated semiconductor, first means coupled to said semiconductors to indicate the source of the extreme potential passed, and second means coupled to discharge said first and second capacitors after the extreme potential passed is identified.

2. A maximum-minimum potential indicator for identifying an extreme potential from a plurality of different potentials comprising a first semiconductor, a first capacitor that displays a potential coupled to said first semiconductor, a second semiconductor, a second capacitor that displays a different potential coupled to said second semiconductor, a source of supply potential, a first load impedance interposed between said first semiconductor and said source of supply potential, a second load impedance interposed between said second semiconductor and said source of supply potential, a first impedance, a source of interrogation signals coupled to feed a signal through said first impedance to said first and second semiconductors simultaneously to pass an extreme potential exhibited by one of said plurality of sources of potentials through an associated semiconductor and load impedance, and means coupled to discharge said first and second capacitor after the extreme potential passed is identified.

3. A potential indicator for identifying a minimum potential from a plurality of different potentials comprising a first transistor of the P-N-P type, a first capacitor that displays a potential coupled to said first transistor, a second transistor of the P-N-P type, a second capacitor that displays a different potential coupled to said second transistor, a source of supply potential, a first load resistor interposed between said first transistor and said source of supply potential, a second load resistor interposed between said second transistor and said source of supply potential, a first resistor, a source of interrogation signals coupled to feed a single pulse signal through said first resistor to said first and second transistors simultaneously to pass the minimum potential exhibited by one of said plurality of capacitors through an associated transistor and load impedance, and means coupled to discharge said first and second capacitors after the maximum potential passed is identified.

4. A potential indicator for identifying a minimum potential from a plurality of different potentials comprising a first transistor of the P-N-P type supporting an emitter terminal, a base terminal, and a collector terminal; a first capacitor to receive and sort a potential coupled to said base terminal of said first transistor; a second transistor of the P-N-P type supporting an emitter terminal, a base terminal, and a collector terminal; a second capacitor to receive and store a second potential coupled to said base terminal of said second transistor; a source of supply potential; a first load resistor interposed between said collector terminal of said first transistor and said source of supply potential; a second load resistor interposed between said collector terminal of said second transistor and said source of supply potential; a third resistor interposed between the base terminal and emitter terminal of said first transistor; a fourth resistor interposed between the base terminal and emitter terminal of said second transistor; a fifth resistor; a source of interrogation signals coupled to feed a single pulse signal through said fifth resistor to said emitter terminals of said first and second transistors simultaneously to pass the minimum potential exhibited by one of said plurality of capacitors through an associated transistor and load resistor; and means coupled to discharge said first and second capacitors after the extreme potential passed is identified.

5. A device for identifying a minimum or a maximum potential from a plurality of potentials comprising a first source of potential; a first switching means coupled to said first source of potential; a second source of potential; a second switching means coupled to said second source of potential; a source of interrogation pulse signals coupled to feed a pulse signal to said first and second switching means simultaneously to activate said switching means coupled to the source that displays the desired extreme potential; means coupling said first switching means to said second switching means and operative upon actuation of one of said switching means to inhibit actuation of the other switching means; and an output terminal coupled to said first and second switching means.

6. A system of the character described, comprising: a plurality of signal pulse sources; a plurality of storage elements, one for each signal pulse source; means coupling each of said signal pulse sources to its respective storage element for producing a potential therein dependent upon the pulses received from its respective signal pulse source causing one of the storage elements to be at an extreme potential compared to the others of said storage elements; a signal translating device coupled to each of said storage elements; a source of interrogation pulses coupled to feed an interrogation pulse to all of said signal translating devices simultaneously; and circuit means operative upon reception of an interrogation pulse by said signal translating devices to produce an output indicative of the signal translating device coupled to the storage element having the extreme potential.

7. A system of the character described, comprising: a plurality of signal pulse sources; a plurality of storage elements, one for each signal pulse source; means coupling each of said signal pulse sources to its respective storage element for producing a potential therein dependent upon the pulses received from its respective signal pulse source causing one of the storage elements to be at an extreme potential compared to the others of said storage elements; a transistor coupled to each of said storage elements; a source of interrogation pulses coupled to feed an interrogation pulse to all of said transistors simultaneously; and circuit means operative upon reception of an interrogation pulse by said transistors to produce an output indicative of the transistor coupled to the storage element having the extreme potential and representative of the magnitude of said extreme potential.

8. A system of the character described, comprising: a plurality of signal pulse sources; a plurality of storage capacitors, one for each signal pulse source; means coupling each of said signal pulse sources to its respective capacitor for producing a potential thereacross indicative of the number of pulses received from its respective signal pulse source, the capacitor receiving the largest number of signal pulses thereby being at an extreme potential compared to the others of said capacitors; a signal translating device coupled to each of said capacitors; a source of interrogation pulses coupled to feed an interrogation pulse to all of said signal translating devices simultaneously; and circuit means operative upon reception of an interrogation pulse by said signal translating device to cause conduction from the signal translating device coupled to the capacitor having the extreme potential.

9. A system of the character described, comprising: a plurality of signal pulse sources; a plurality of storage capacitors, one for each signal pulse source; means coupling each of said signal pulse sources to its respective capacitor for producing a potential thereacross indicative of the number of pulses received from its respective signal pulse source, the capacitor receiving the largest number of signal pulses thereby being at an extreme potential compared to the others of said capacitors; a signal translating device coupled to each of said capacitors; a source of interrogation pulses coupled to feed an interrogation pulse to all of said signal translating devices simultaneously; circuit means operative upon reception of an interrogation pulse by said signal translating device to cause conduction from the signal translating device coupled to the capacitor having the extreme potential; and means coupling said signal translating devices together and operative upon the conduction of one said signal translating devices to inhibit conduction of the remaining signal translating devices.

10. A system of the character described, comprising: a plurality of signal pulse sources; a plurality of storage capacitors, one for each signal pulse source; means coupling each of said signal pulse sources to its respective capacitor for producing a potential thereacross indicative of the number of pulses received from its respective signal pulse source, the capacitor receiving the largest number of signal pulses thereby being at an extreme potential compared to the others of said capacitors; a signal translating device coupled to each of said capacitors; a source of interrogation pulses coupled to feed an interrogation pulse to all of said signal translating devices simultaneously; circuit means operative upon reception of an interrogation pulse by said signal translating device to cause conduction from the signal translating device coupled to the capacitor having the extreme potential; and means to discharge said capacitors after conduction of said signal translating device having the extreme potential.

11. A system of the character described, comprising: a plurality of signal pulse sources; a plurality of storage capacitors, one for each signal pulse source; means coupling each of said signal pulse sources to its respective capacitor for producing a potential thereacross indicative of the number of pulses received from its respective signal pulse source, the capacitor receiving the largest number of signal pulses thereby being at an extreme potential compared to the others of said capacitors; a transistor coupled to each of said capacitors; a source of interrogation pulses coupled to feed an interrogation pulse to all of said transistors simultaneously; circuit means operative upon reception of an interrogation pulse by said transistor to cause conduction from the transistor coupled to the capacitor having the extreme potential; and means coupling said transistors together and operative upon the conduction of one of said transistors to inhibit conduction of the remaining transistors.

12. A system of the character described, comprising: at least three potential sources, one of which is at an extreme minimum or maximum potential to be identified; a signal translating device coupled to each of said potential sources; a source of interrogation signals coupled to feed an interrogation signal to all of said signal translating devices simultaneously; circuit means operative upon reception of an interrogation signal by said signal translating devices to cause conduction from the signal translating device coupled to the source of the extreme potential to be identified; and means coupling said signal translating devices together and operative upon the conduction of one of said signal translating devices to inhibit conduction of the remaining signal translating devices.

References Cited in the file of this patent

UNITED STATES PATENTS

| | | |
|---|---|---|
| 2,556,200 | Lesti | June 12, 1951 |
| 2,557,729 | Eckert | June 19, 1951 |
| 2,627,039 | MacWilliams | Jan. 27, 1953 |
| 2,644,892 | Gehman | July 7, 1953 |
| 2,755,338 | Richmond | July 17, 1956 |
| 2,817,771 | Barnothy | Dec. 24, 1957 |
| 2,880,331 | MacSorley | Mar. 31, 1959 |